(12) United States Patent
Jang et al.

(10) Patent No.: US 11,658,124 B2
(45) Date of Patent: May 23, 2023

(54) CONNECTION STRUCTURE EMBEDDED SUBSTRATE

(71) Applicant: SAMSUNG ELECTRO-MECHANICS CO., LTD., Suwon-si (KR)

(72) Inventors: Yong Soon Jang, Suwon-si (KR); Hyung Ki Lee, Suwon-si (KR); Ki Suk Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 127 days.

(21) Appl. No.: 17/313,310

(22) Filed: May 6, 2021

(65) Prior Publication Data
US 2022/0157730 A1    May 19, 2022

(30) Foreign Application Priority Data
Nov. 13, 2020  (KR) .................. 10-2020-0152195

(51) Int. Cl.
| | | |
|---|---|---|
| H01L 23/538 | (2006.01) | |
| H01L 21/48  | (2006.01) | |
| H01L 23/498 | (2006.01) | |
| H01L 23/00  | (2006.01) | |

(52) U.S. Cl.
CPC ........ *H01L 23/5385* (2013.01); *H01L 21/486* (2013.01); *H01L 21/4857* (2013.01); *H01L 23/5381* (2013.01); *H01L 23/5383* (2013.01); *H01L 23/5386* (2013.01); *H01L 24/19* (2013.01); *H01L 24/24* (2013.01); *H01L 24/82* (2013.01); *H01L 24/97* (2013.01); *H01L 23/49894* (2013.01); *H01L 24/16* (2013.01); *H01L 2224/16235* (2013.01)

(58) Field of Classification Search
CPC ..... H01L 21/4857; H01L 24/19; H01L 24/24; H01L 24/82; H01L 24/97; H01L 23/5385; H01L 23/5381; H01L 23/5383; H01L 23/5384
See application file for complete search history.

(56) References Cited

U.S. PATENT DOCUMENTS

| | | | |
|---|---|---|---|
| 7,573,135 B2 | 8/2009 | Sunohara et al. | |
| 2014/0091474 A1* | 4/2014 | Starkston | ............ H01L 23/5385 361/767 |

(Continued)

FOREIGN PATENT DOCUMENTS

KR    10-1966328 B1    4/2019

*Primary Examiner* — Alonzo Chambliss
(74) *Attorney, Agent, or Firm* — Morgan, Lewis & Bockius LLP (57) ABSTRACT

A connection structure embedded substrate includes a printed circuit board including a plurality of first insulating layers, and a plurality of first wiring layers disposed on or between the plurality of first insulating layers; and a connection structure embedded in the printed circuit board, and including a plurality of second insulating layers and a plurality of second wiring layers disposed on or between the plurality of second insulating layers. A lowermost second insulating layer of the plurality of second insulating layers includes an organic insulating material, and is in contact with an upper surface of one of the plurality of first insulating layers.

23 Claims, 9 Drawing Sheets

(56) References Cited

U.S. PATENT DOCUMENTS

| | | | |
|---|---|---|---|
| 2014/0118976 A1* | 5/2014 | Yoshikawa | H01L 23/5384 361/761 |
| 2015/0116965 A1* | 4/2015 | Kim | H01L 23/5385 361/767 |
| 2016/0037647 A1* | 2/2016 | Shimizu | H05K 3/4697 361/764 |
| 2016/0105960 A1* | 4/2016 | Sakamoto | H01L 23/5383 174/262 |
| 2016/0141234 A1* | 5/2016 | We | H01L 23/5385 361/767 |
| 2016/0172292 A1* | 6/2016 | Hsu | H01L 23/49833 257/698 |
| 2020/0194300 A1 | 6/2020 | Konchady et al. | |

* cited by examiner

CONNECTION STRUCTURE EMBEDDED SUBSTRATE

CROSS-REFERENCE TO RELATED APPLICATION(S)

This application claims benefit of priority to Korean Patent Application No. 10-2020-0152195 filed on Nov. 13, 2020 in the Korean Intellectual Property Office, the disclosure of which is incorporated herein by reference in its entirety.

TECHNICAL FIELD

The present disclosure relates to a connection structure embedded substrate.

BACKGROUND

Recently, in the electronic components industry, a highly integrated printed circuit board (PCB) has been required in response to 5G high-speed communications and artificial intelligence (AI). A microcircuit is a core technology for a highly integrated PCB, and currently, there has been active research on a microcircuit in the related field, but there has been the issue of an increase of costs caused by a decrease of yield in manufacturing a substrate as a substrate is designed to be stacked while having a large area. Accordingly, as for a region requiring a microcircuit, a technique for separately manufacturing a connection structure and embedding the connection structure in a substrate having a large area. For example, the technique of an embedded multi-die interconnect bridge (EMIB) has been used.

In the case of an EMIB, a cavity may be formed in a PCB, and a connection structure may need to be fixed to a metal stopper using an adhesive attached to the connection structure such that the connection structure may not move and may be fastened. In this case, an additional process for forming a cavity may be required, and as an adhesive used for bonding a connection structure, such as a die attach film (DAF), has a short lifespan and is expensive, it may be difficult to manage the lifespan thereof, which may increase costs.

SUMMARY

An aspect of the present disclosure is to provide a connection structure which may be embedded in a substrate without forming a cavity and an adhesive for bonding the connection structure.

Another aspect of the present disclosure is to provide a connection structure embedded substrate which may improve electrical properties in die-to-die transmission of a high speed signal.

Another aspect of the present disclosure is to bond a connection structure using a semi-cured or partially cured insulating material in a substrate and/or a connection structure.

According to an aspect of the present disclosure, a connection structure embedded substrate includes a printed circuit board including a plurality of first insulating layers, and a plurality of first wiring layers disposed on or between the plurality of first insulating layers; and a connection structure embedded in the printed circuit board, and including a plurality of second insulating layers and a plurality of second wiring layers disposed on or between the plurality of second insulating layers. A lowermost second insulating layer of the plurality of second insulating layers includes an organic insulating material, and is in contact with an upper surface of one of the plurality of first insulating layers.

According to another aspect of the present disclosure, a connection structure embedded substrate includes a printed circuit board including a plurality of first insulating layers, a plurality of first wiring layers, and a plurality of first wiring via layers; and a connection structure embedded in the printed circuit board and including a plurality of second insulating layers, a plurality of second wiring layers, and a plurality of second wiring via layers. An uppermost second wiring layer of the plurality of second wiring layers is embedded in an upper side of an uppermost second insulating layer of the plurality of second insulating layers and an upper surface of the uppermost second insulating layer of the plurality of second insulating layers is exposed. A lowermost second insulating layer of the plurality of second insulating layers includes an organic insulating material having a dielectric dissipation factor (Df) of 0.010 or less.

According to another aspect of the present disclosure, a connection structure embedded substrate includes a printed circuit board including a plurality of first insulating layers, and a plurality of first wiring layers disposed on or between the plurality of first insulating layers; and a connection structure embedded in the printed circuit board, and including a plurality of second insulating layers and a plurality of second wiring layers disposed on or between the plurality of second insulating layers. A lower surface of a lowermost second wiring layer is covered by a lowermost second insulating layer of the plurality of second insulating layers. An uppermost first insulating layer of the plurality of first insulating layer covers a side surface and an upper surface of the connection structure. An uppermost first wiring layer of the plurality of first wiring layers is connected to the connection structure through a first via disposed in a portion of the uppermost first insulating layer covering the connection structure, and is connected to one of the plurality of first wiring layers through a second via penetrating through the uppermost first insulating layer. A thickness of the second via is greater than a thickness of the connection structure.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Figure 1:
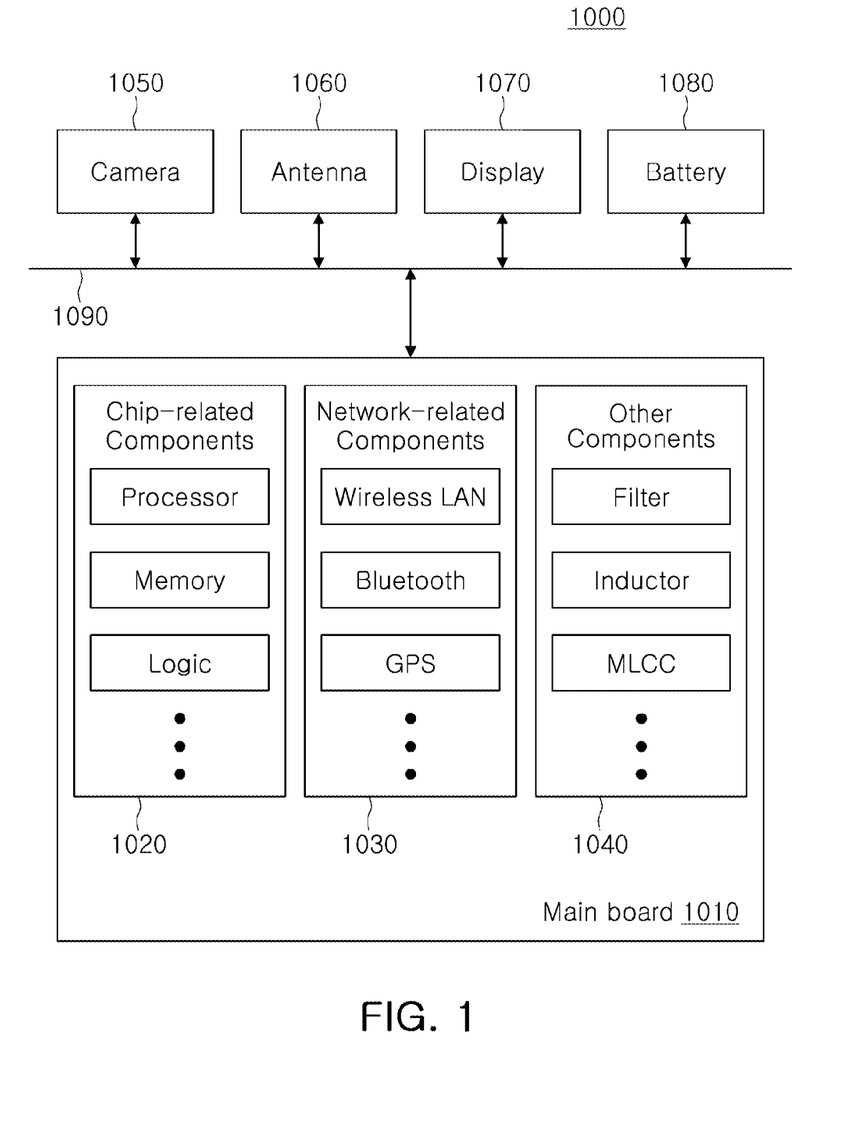
FIG. 1 is a block diagram illustrating an example of an electronic device system.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. Also, the chip related components 1020 may be combined with each other. The chip related components 1020 may have a package form including the above-described chip.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. Also, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. Also, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec, a video codec, a power amplifier, a compass, an accelerometer, a gyroscope, a speaker, a mass storage unit (for example, a hard disk drive), a compact disk (CD) drive), a digital versatile disk (DVD) drive, or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
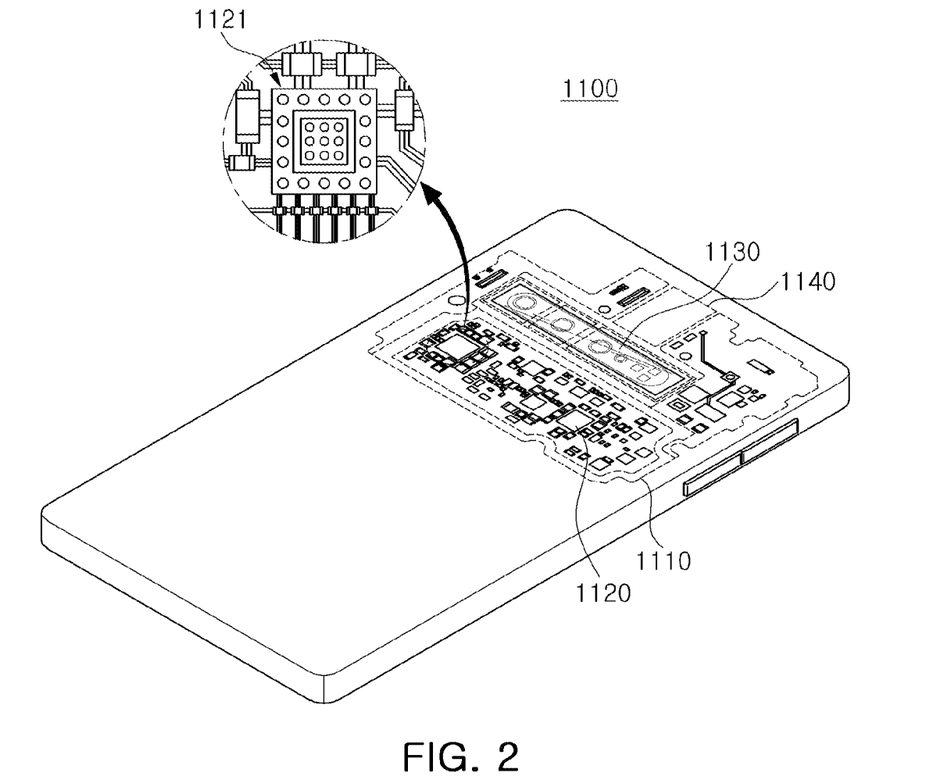
FIG. 2 is a perspective diagram illustrating an example of an electronic device.

FIG. 2 is a perspective diagram illustrating an example of an electronic device.

Referring to FIG. 2, the electronic device may be implemented by a smartphone 1100. A motherboard 1110 may be accommodated in a smartphone 1100, and various electronic components 1120 may be physically or electrically connected to the motherboard 1110. The camera module 1130 and/or the speaker 1140 may be accommodated therein. Some of the components 1120 may be the chip related components, such as a component package 1121, for example, but an example embodiment thereof is not limited thereto. In the component package 1121, a plurality of electronic components may be disposed on a multilayer printed circuit board in the form of surface mounting, but an example embodiment thereof is not limited thereto. The electronic device is not necessarily limited to the smartphone 1100, and may be other electronic devices as described above.

Figure 3:
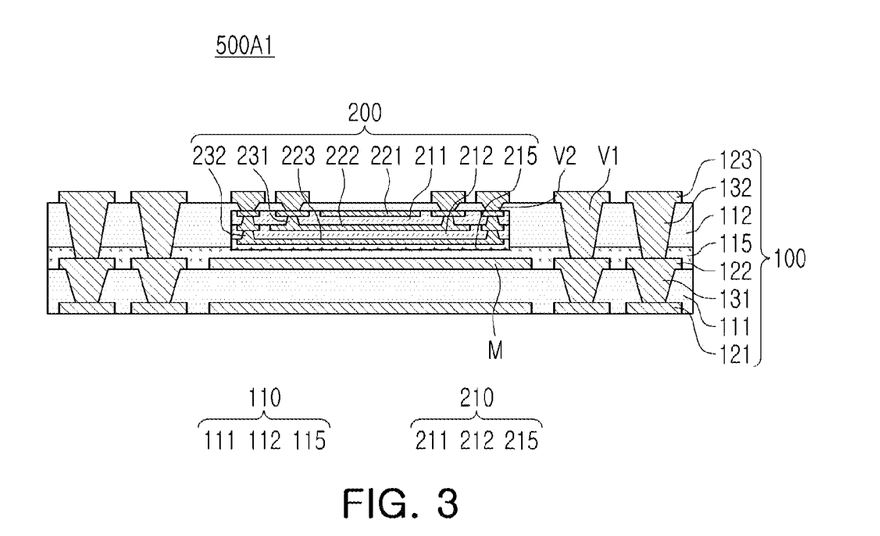
FIG. 3 is a cross-sectional diagram illustrating an example of a connection structure embedded substrate.

FIG. 3 is a cross-sectional diagram illustrating an example of a connection structure embedded substrate.

Referring to the diagram, a connection structure embedded substrate 500A1 in the example embodiment may include a printed circuit board 100 including a first insulating body 110 including a plurality of first insulating layers 111, 112, and 115, a plurality of first wiring layers 121, 122, and 123 disposed on or in the first insulating body 110 and a plurality of first wiring via layers 131 and 132 disposed in the first insulating body 110, and a connection structure 200 including a second insulating body 210 embedded in the first insulating body 110 and including a plurality of second insulating layers 211, 212, and 215, a plurality of second wiring layers 221, 222, and 223 disposed on or in the second insulating body 210, and a plurality of second wiring via layers 231 and 232 disposed in the second insulating body 210. Each of the first insulating layers 111, 112 and 115 of the first insulating body 110 and each of the second insulating layers 211, 212 and 215 of the second insulating body 210 may include insulating resin. A lower surface of the second insulating body 210 may be in contact with the first insulating body 110.

As described above, the connection structure embedded substrate 500A1 in the example embodiment may have a structure in which the connection structure 200 is embedded without forming a cavity in the printed circuit board 100.

Also, a lower surface of the second insulating body 210 of the connection structure 200 may be bonded to the first insulating body 110 such that the connection structure 200 may be in contact with the printed circuit board 100. Accordingly, the issues related to a printed circuit board in which an EMIB is embedded may be addressed.

The lower surface of the second insulating body 210 of the connection structure 200 may be in contact with an upper surface of a first organic insulating layer 115, one of the plurality of first insulating layers 111, 112, and 115 of the first insulating body 110 of the printed circuit board 100. The first organic insulating layer 115 may be disposed in a semi-cured or partially cured state before the connection structure 200 is disposed, and the connection structure 200 may be bonded onto the semi-cured or partially cured first organic insulating layer 115. When the first organic insulating layer 115 is cured through a curing process after the connection structure 200 is bonded, the connection structure 200 may be fastened. Accordingly, an adhesive may not be necessary. In the semi-cured or partially cured state of the first organic insulating layer 115, the connection structure 200 may be partially recessed while being bonded, such that, after being cured, the upper surface of the first organic insulating layer 115 may have a stepped portion in a region in contact with the lower surface of the insulating body 210 of the connection structure 200.

The first organic insulating layer 115 may include an organic insulating material semi-cured or partially cured. For example, the first organic insulating layer 115 may include at least one of Ajinomoto build-up film (ABF) and polyimide, but an example embodiment thereof is not limited thereto. A dielectric dissipation factor (Df) of the first organic insulating layer 115 may be 0.010 or less, 0.005 or less, for example. When the ABF and/or polyimide under the above-mentioned conditions, and a plurality of dies are mounted on the connection structure embedded substrate 500A1, electrical properties in die-to-die transmission of a high-speed signal may improve. If necessary, a dielectric constant (Dk) of the first organic insulating layer 115 may be 3.5 or less, 3.2 or less, for example.

In the connection structure 200, the second organic insulating layer 215 may be disposed on a lowermost side of the connection structure 200. In this case, the second organic insulating layer 215, a lowermost layer of the plurality of second insulating layers 211, 212, and 215 of the second insulating body 210 of the connection structure 200, may be in a semi-cured or partially cured state, and the connection structure 200 may be bonded to the first organic insulating layer 115 of the printed circuit board 100 through the second organic insulating layer 215 in the semi-cured or partially cured state. When the second organic insulating layer 215 is cured through a curing process after the connection structure 200 is bonded, the connection structure 200 may be fastened. Accordingly, an adhesive may not be necessary.

The second organic insulating layer 215, the lowermost layer of the plurality of second insulating layers 211, 212, and 215 of the connection structure 200, may include an organic insulating material semi-cured or partially cured. For example, the second organic insulating layer 215 may include at least one of ABF and polyimide, but an example embodiment thereof is not limited thereto. A dielectric dissipation factor (Df) of the second organic insulating layer 215 may be 0.010 or less, 0.005 or less, for example. When the ABF and/or polyimide is used under these conditions, and a plurality of dies are mounted on the connection structure embedded substrate 500A1, electrical properties in die-to-die transmission of a high-speed signal may improve. If necessary, a dielectric constant (Dk) of the second organic insulating layer 215 may be 3.5 or less, 3.2 or less, for example.

The lower surface of the second organic insulating layer 215, the lowermost layer of the plurality of second insulating layers 211, 212, and 215 of the connection structure 200, may be in contact with the upper surface of the first organic insulating layer 115, one of the plurality of first insulating layers 111, 112, and 115 of the printed circuit board 100. In this case, to improve bonding, the first organic insulating layer 115 of the printed circuit board 100 may also be in a semi-cured or partially cured state before the connection structure 200 is disposed, and in this case, the connection structure 200 may be partially recessed while being bonded, such that, after being cured, the upper surface of the first organic insulating layer 115 may have a stepped portion in a region in contact with the lower surface of the second insulating body 210 of the connection structure 200.

An uppermost first wiring layer 123 of the plurality of first wiring layers 121, 122, 123 of the printed circuit board 100 may be electrically connected to the first wiring layer 122, disposed in an inner portion, of the first wiring layers 121, 122, and 123 of the printed circuit boards 100, through a first wiring via V1 collectively penetrating the uppermost first insulating layer 112 of the plurality of first insulating layers 111, 112, and 115 and the first organic insulating layer 115.

The uppermost second wiring layer 221 of the plurality of second wiring layers 221, 222, and 223 of the connection structure 200 may be buried in an upper side of the uppermost second insulating layer 211 of the plurality of second insulating layers 211, 212, and 215 and an upper surface thereof may be exposed. An exposed upper surface of the second wiring layer 221 disposed on an uppermost side of the connection structure 200 may be covered by the uppermost first insulating layer 112 of the plurality of first insulating layers 111, 112, and 115 of the printed circuit board 100 described above. The exposed upper surface of the second wiring layer 221 disposed on the uppermost side of the connection structure 200 may be electrically connected to the uppermost first wiring layer 123 of the plurality of first wiring layers 121, 122, and 123 of the printed circuit board 100. The second wiring via V2 may penetrate only the uppermost first insulating layer 112 of the plurality of first insulating layers 111, 112 and 115 of the printed circuit board 100.

The first wiring layer 122, disposed in an inner portion, of the plurality of first wiring layers 121, 122, and 123 of the printed circuit board 100 may include a metal pattern M. The metal pattern M may be disposed on the upper surface of the lowermost first insulating layer 111 of the plurality of first insulating layers 111, 112, and 115 of the printed circuit board 100. The lower surface of the second insulating body 210 of the connection structure 200 may be spaced apart from the upper surface of the metal pattern M. The metal pattern M may be disposed on a lower side of the second insulating body 210 of the connection structure 200 and may be spaced apart from the second insulating body 210. A region between the lower surface of the second insulating body 210 of the connection structure 200 and the upper surface of the metal pattern M may be filled with the first organic insulating layer 115. The metal pattern M may have a width larger than that of the second insulating body 210 of the connection structure 200.

In the description below, the elements of the connection structure embedded substrate 500A1 will be described in accordance with an example embodiment with reference to the drawings.

The printed circuit board 100 may include a first insulating body 110 including a plurality of first insulating layers 111, 112, 115, a plurality of first wiring layers 121, 122, 123, and a plurality of first wiring via layers 131 and 132. Each of the plurality of first wiring layers 121, 122, and 123 may include a conductor pattern, and the plurality of first wiring via layers 131 and 132 may electrically connect the conductor patterns of the plurality of first wiring layers 121, 122, and 123 to each other. The printed circuit board 100 may have a form of a coreless substrate. For example, the printed circuit board 100 may include a 1-1 insulating layer 111, a 1-1 wiring layer 121 embedded in a lower side of the 1-1 insulating layer 111, a 1-2 wiring layer 122 disposed on an upper surface of the 1-1 insulating layer 111, a 1-1 wiring via layer 131 penetrating the 1-1 insulating layer 111 and connecting the 1-1 wiring layer 121 to the 1-2 wiring layer 122, a first organic insulating layer 115 disposed on the upper surface of the 1-1 insulating layer 111 and covering the 1-2 wiring layer 122, a 1-2 insulating layer 112 disposed on an upper surface of the first organic insulating layer 115, a 1-3 wiring layer 123 disposed on an upper surface of the 1-2 insulating layer 112, a first wiring via V1 collectively penetrating the 1-2 insulating layer 112 and the first organic insulating layer 115 and connecting the 1-2 wiring layer 122 to the 1-3 wiring layer 123, and a second wiring via layer 132 penetrating the 1-2 insulating layer 112 and connecting the 1-2 wiring layer 122 to the 1-3 wiring layer 123.

An insulating material may be used as a material for the plurality of first insulating layers 111, 112, 115, and as an insulating material, a thermosetting resin such as epoxy resin or a thermoplastic resin such as polyimide, and the above-mentioned resin including inorganic fillers such as silica and/or reinforcing materials such as glass fibers may be used. For example, an ABF, prepreg, etc., may be used. For example, the 1-1 insulating layer 111 and the 1-2 insulating layer 112 may include a prepreg, and the first organic insulating layer 115 may include ABF or polyimide. The first organic insulating layer 115 may include ABF with a low Df or polyimide with a low Df having a small dielectric dissipation factor (Df). Alternatively, the first organic insulating layer 115 may include ABF with a low Df/Dk or polyimide with a low Df/Dk having a low dielectric dissipation factor (Df) and a dielectric constant (Dk). Each of the 1-1 insulating layer 111 and the 1-2 insulating layer 112 may have a modulus greater than that of the first organic insulating layer 115. Each of the 1-1 insulating layer 111 and the 1-2 insulating layer 112 may have a thickness greater than that of the first organic insulating layer 115. The number of the plurality of first insulating layers 111, 112, and 115 may be greater or less than the example illustrated in the drawings.

A metal material may be used as a material of the plurality of first wiring layers 121, 122, 123, and as a metal material, and as the metal material, copper (Cu), aluminum (Al), silver (Ag), tin (Sn), gold (Au), nickel (Ni), lead (Pb), titanium (Ti), or an alloy thereof may be used. Each of the plurality of first wiring layers 121, 122, and 123 may perform various functions according to a design. For example, the plurality of first wiring layers 121, 122, and 123 may include a ground pattern, a power pattern, a signal pattern, and the like. Each of these patterns may have a line shape, a plane shape, or a pad shape. The plurality of first wiring layers 121, 122, and 123 may be formed by a plating process such as an additive process (AP), a semi-AP (SAP) process, a modified SAP (MSAP) process, a tenting (TT) process, or the like, and may thus include a seed layer, an electroless plating layer, and an electrolytic plating layer formed on the basis of the seed layer. If necessary, a primer copper foil may be further included. The number of the plurality of first wiring layers 121, 122, and 123 may be greater or less than the example in the drawings.

A metal material may also be used as the material of the plurality of first wiring via layers 131 and 132, and as a metal material, and as the metal material, copper (Cu), aluminum (Al), silver (Ag), tin (Sn), gold (Au), nickel (Ni), lead (Pb), titanium (Ti), or an alloy thereof may be used. Each of the plurality of first wiring via layers 131 and 132 may include a signal connection via, a ground connection via, a power connection via, and the like, according to a design. Each of the wiring vias of the plurality of first wiring via layers 131 and 132 may be entirely filled with a metal material, or a metal material may be formed along a wall surface of the via hole. Each of the plurality of first wiring via layers 131 and 132 may have a tapered shape. The plurality of first wiring via layers 131 and 132 may be formed by a plating process such as AP, SAP, MSAP, TT, or the like, for example, and may thus include an electroless plating layer, a seed layer, and an electroplating layer formed on the basis of the seed layer. The number of the plurality of first wiring via layers 131 and 132 may be greater or less than the example in the drawings.

The connection structure 200 may include a second insulating body 210 including a plurality of second insulating layers 211, 212, and 215, and a plurality of second wiring layers 221, 222, and 223 and a plurality of second wiring via layers 231 and 232. Each of the plurality of first wiring layers 221, 222, and 223 may include a conductor pattern, and the plurality of second wiring via layers 231 and 232 may electrically connect the conductor patterns to each other. The connection structure 200 may have a form of a coreless substrate. For example, the connection structure 200 may include a 2-1 insulating layer 211, a 2-1 wiring layer 221 embedded in an upper side of the 2-1 insulating layer 211, a 2-2 wiring layer 222 disposed on a lower surface of the 2-1 insulating layer 211, a 2-1 wiring via layer 231 connecting the 2-1 wiring layer 221 to the 2-2 wiring layer 222, a 2-2 insulating layer 212 disposed on a lower surface of the 2-1 insulating layer 211 and covering the 2-2 wiring layer 222, a 2-3 wiring layer 223 disposed on a lower surface of the 2-2 insulating layer 212, a second wiring via layer 232 penetrating the 2-2 insulating layer 212 and connecting the 2-2 wiring layer 222 to the 2-3 wiring layer 223, and a second organic insulating layer 215 disposed on a lower surface of the 2-2 insulating layer 212 and covering the 2-3 wiring layer 223.

Figure 4:
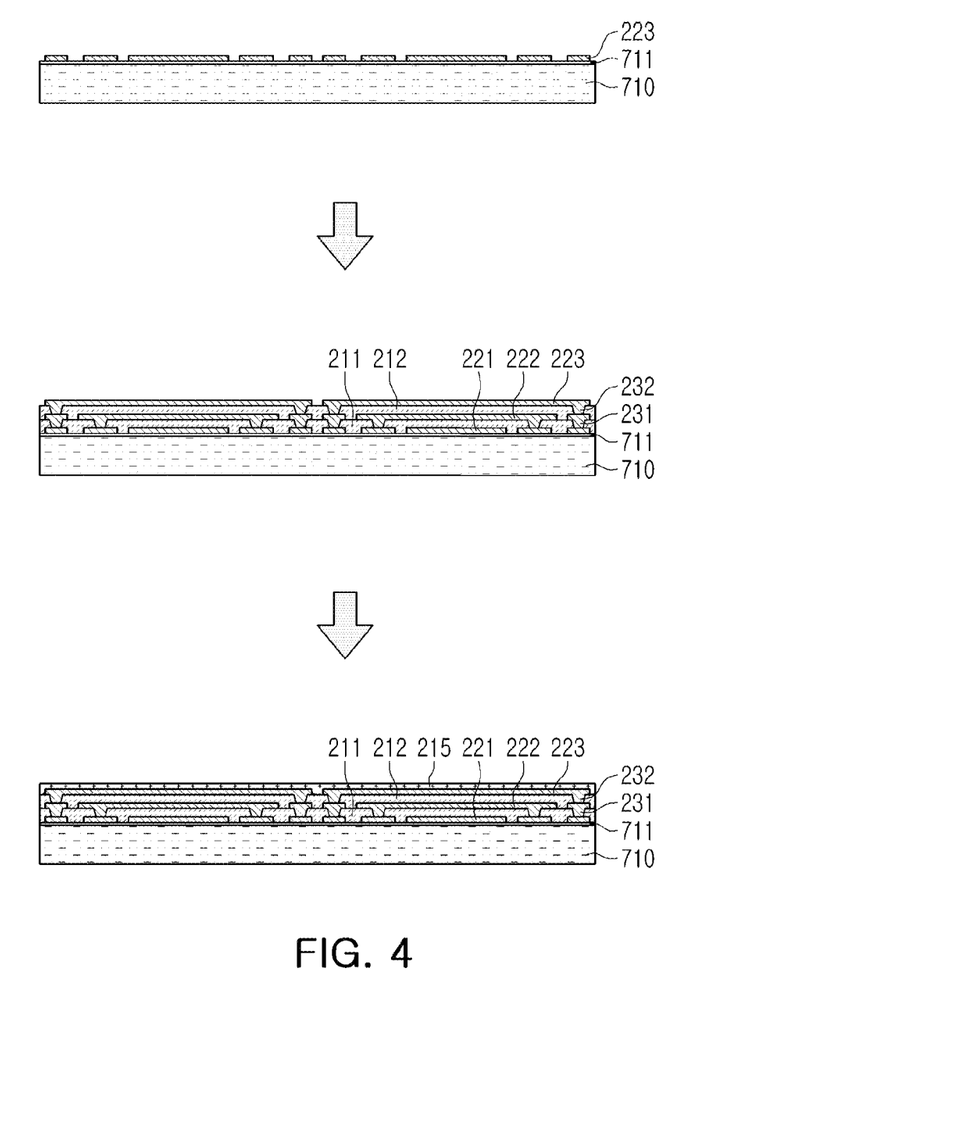
FIGS. 4 and 5 are process diagrams illustrating an example of manufacturing the connection structure embedded substrate illustrated in FIG. 3.
Figure 5:
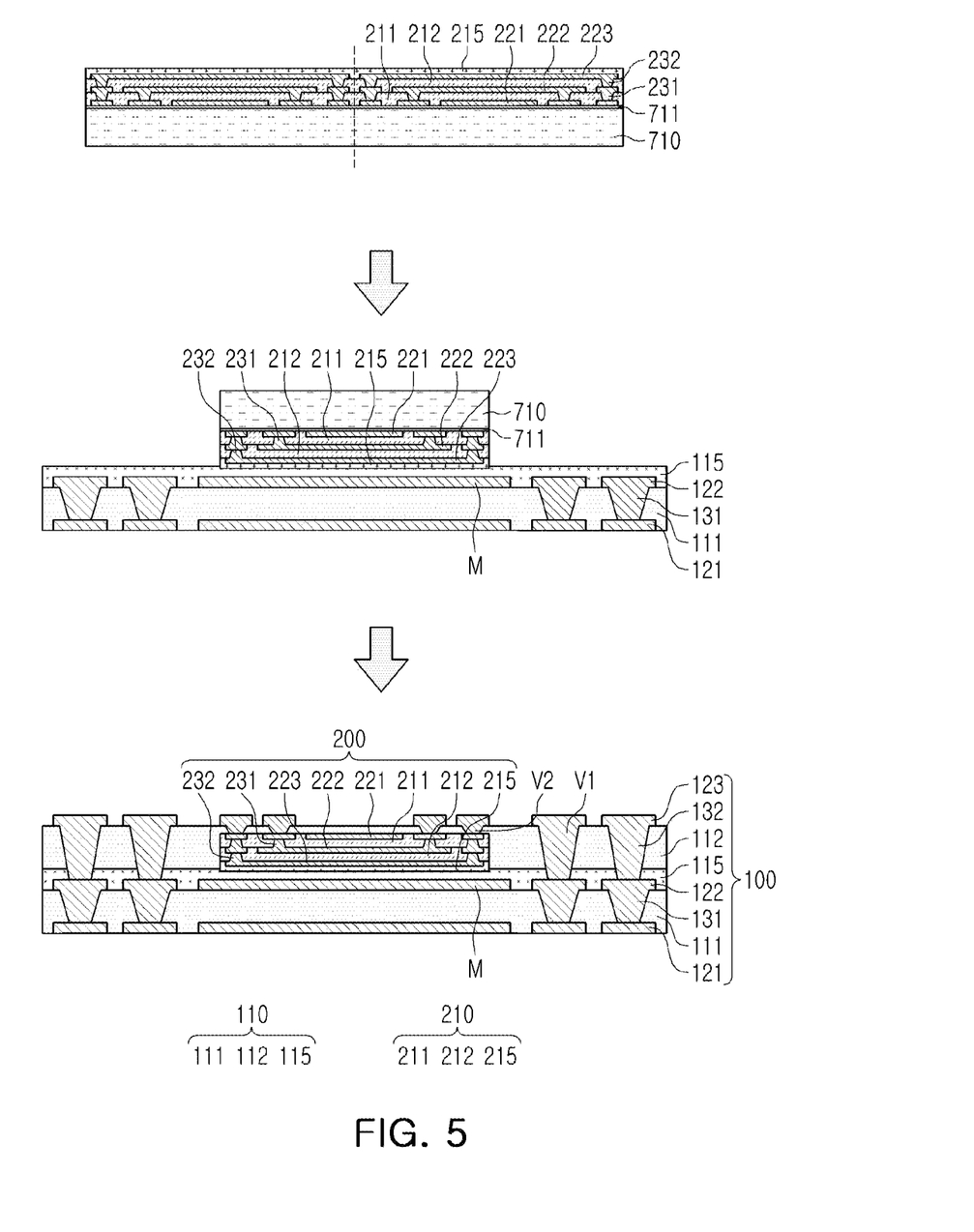

During manufacturing, the connection structure 200 may be disposed on a carrier 710 and may be disposed upside down such that the connection structure 200 may be bonded to the first organic insulating layer 115 of a precursor of the printed circuit board 100, as shown in FIGS. 4 and 5 to be described later. Accordingly, the connection structure 200 in the final structure may be disposed upside down as compared to the state before the connection structure 200 is bonded.

For example, the connection structure 200 disposed on the first organic insulating layer 115 of the printed circuit board 100 may include a second organic insulating layer 215, a 2-3 wiring layer 223 embedded in an upper side of the second organic insulating layer 215, a 2-2 insulating layer 212 disposed on the upper surface of the second organic insulating layer 215, a 2-2 wiring layer 222 embedded in an upper side of the 2-2 insulating layer 212, a second wiring via layer 232 penetrating the 2-2 insulating layer 212 and connecting the 2-2 wiring layer 222 to the 2-3 wiring layer 223, a 2-1 insulating layer 211 disposed on an upper surface of the 2-2 insulating layer 212, a 2-1 wiring layer 221 embedded in an upper side of the 2-1 insulating layer 211 and having an upper surface thereof exposed, and a 2-1 wiring via layer 231 penetrating the 2-1 insulating layer 211 and connecting the 2-1 wiring layer 221 to the 2-2 wiring layer 222.

An insulating material may be used as a material for the plurality of second insulating layers 211, 212, and 215. For example, as the insulating material of the 2-1 insulating layer 211 and the 2-2 insulating layer 2-2, a photosensitive insulating material, a photo imagable dielectric (PID) may be used, and as an insulating material of the second organic insulating layer 215, ABF, polyimide, or the like, may be used. The second organic insulating layer 215 may include ABF with a low Df or polyimide of a low Df having a small dielectric dissipation factor (Df). Alternatively, the second organic insulating layer 215 may include ABF with a low Df/Dk or polyimide with a low Df/Dk having a small dielectric dissipation factor (Df) and a dielectric constant (Dk). The number of the plurality of second insulating layers 211, 212, and 215 may be greater or less than the example illustrated in the drawings.

A metal material may be used as a material for the plurality of second wiring layers 221, 222, and 223, and as the metal material, copper (Cu), aluminum (Al), silver (Ag), Tin (Sn), gold (Au), nickel (Ni), lead (Pb), titanium (Ti), or an alloy thereof may be used. Each of the plurality of second wiring layers 221, 222, and 223 may perform various functions according to a design. For example, the plurality of second wiring layers 221, 222, and 223 may include a ground pattern, a power pattern, a signal pattern, and the like. Each of these patterns may have a line shape, a plane shape, or a pad shape. The plurality of second wiring layers 221, 222, and 223 may be formed by a plating process by a plating process, such as AP, SAP, MSAP, TT, or the like, and may thus include an electroless plating layer, a seed layer, and an electroplating layer formed on the basis of the seed layer. If necessary, a primer copper foil may be further included. The number of the plurality of second wiring layers 221, 222, and 223 may be greater or less than the example in the drawings.

A metal material may be used as a material for the plurality of second wiring via layers 231 and 232, and as the metal material, copper (Cu), aluminum (Al), silver (Ag), tin (Sn), gold (Au), nickel (Ni), lead (Pb), titanium (Ti), or an alloy thereof may be used. Each of the plurality of second wiring via layers 231 and 232 may also include a signal connection via, a ground connection via, a power connection via, or the like according to a design. Each of the wiring vias of the plurality of second wiring via layers 231 and 232 may be completely filled with a metal material, or a metal material may be formed along a wall surface of the via hole. Each of the plurality of second wiring via layers 231 and 232 may have a tapered shape. The plurality of second wiring via layers 231 and 232 may be formed by a plating process, such as AP, SAP, MSAP, TT, or the like, for example, and may thus include an electroless plating layer, a seed layer, and an electroplating layer formed on the basis of the seed layer. The number of the plurality of second wiring via layers 231 and 232 may be greater or less than the example in the drawings.

The plurality of second wiring layers 221, 222, and 223 of the connection structure 200 may include a circuit having density relatively higher than that of the plurality of first wiring layers 121, 122, and 123 of the printed circuit board 100. In other words, the average density of the plurality of second wiring layers higher than the average density of the plurality of first wiring layers. The high density may indicate that the plurality of second wiring layers 221, 222, and 223 may have a fine pitch and/or a relatively small gap therebetween.

As an example of a high-density circuit, the plurality of second wiring layers 221, 222, 223 of the connection structure 200 may have a fine pitch as compared to the plurality of first wiring layers 121, 122, and 123 of the printed circuit board 100.

The pitch may refer to a distance from a center of one conductor pattern to a center of another adjacent conductor pattern in each of the wiring layers disposed on the same level. Also, a pitch of the plurality of first wiring layers 121, 122, and 123 and the plurality of second wiring layers 221, 222, and 223 in the example embodiment does not refer to the pitch of each wiring layer, but an average pitch. Thus, the configuration in which the plurality of second wiring layers 221, 222, and 223 of the connection structure 200 may have a relatively fine pitch as compared to the plurality of first wiring layers 121, 122, and 123 of the printed circuit board 100 may indicate that an average value of pitches in the plurality of second wiring layers 221, 222, and 223 may be smaller than an average value of pitches in the plurality of first wiring layers 121, 122, and 123.

For example, when the average pitch of at least one of the plurality of first wiring layers 121, 122, and 123 of the printed circuit board 100 is referred to as a first pitch, and the average pitch of at least one of the second wiring layers 221, 222, and 223 of the connection structure 200 is a second pitch, the first pitch may be greater than the second pitch.

As another example of high-density circuit, when the average gap between the plurality of first wiring layers 121, 122, and 123 of the printed circuit board 100 is referred to as a first gap, and the average gap between the plurality of second wiring layers 221, 222, and 223 of the connection structures 200 is a second gap, the first gap may be greater than the second gap. Here, the gap may refer to a gap between the plurality of first wiring layers 121, 122, and 123 and between the plurality of second wiring layers 221, 222, and 223.

As the descriptions of the other configurations may be the same as above, the detailed descriptions thereof will not be repeated.

FIGS. 4 and 5 are process diagrams illustrating an example of manufacturing the connection structure embedded substrate illustrated in FIG. 3.

Referring to FIG. 4, a carrier 710 having a seed layer 711 formed on at least one surface thereof may be prepared. Thereafter, a plurality of second insulating layers 211, 212, and 215, a plurality of second wiring layers 221, 222, and 223, and a plurality of second wiring via layers 231, 232, and 233 may be formed on the on the seed layer 711 of the carrier 710. The plurality of second insulating layers 211, 212, and 215 may be formed by coating and curing an insulating material or laminating and curing an insulating film. The plurality of second wiring layers 221, 222, and 223 may be formed through a plating process. The plurality of second wiring via layers 231, 232, and 233 may be formed through a plating process after processing a via hole through a photolithography process, or the like. Accordingly, a laminate may be formed.

Referring to FIG. 5, thereafter, the laminate may be sawed with the carrier 710 attached, and the laminated provided by a unit, the connection structure 200 may be bonded to the first organic insulating layer 115 of the precursor of the printed circuit board 100 using the semi-cured or partially cured second organic insulating layer 215. Thereafter, the carrier 710 may be separated, and the seed layer 711 may be removed by etching. Thereafter, the connection structure 200 may be embedded by the 1-2 insulating layer 112, the other necessary processes may be performed, and the connection structure 200 may be fastened through a curing process, thereby manufacturing the connection structure embedded substrate 500A1 described in the aforementioned example embodiment.

As the descriptions of the other configurations may be the same as above, the detailed descriptions thereof will not be repeated.

Figure 6:
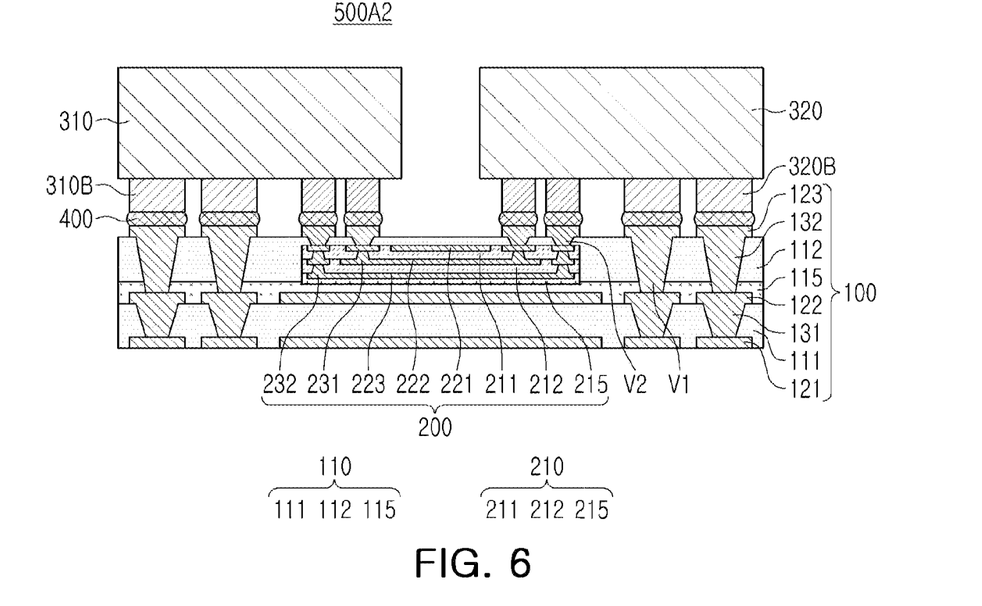
FIG. 6 is a cross-sectional diagram illustrating a modified example of a connection structure embedded substrate.

FIG. 6 is a cross-sectional diagram illustrating a modified example of a connection structure embedded substrate.

Figure 7:
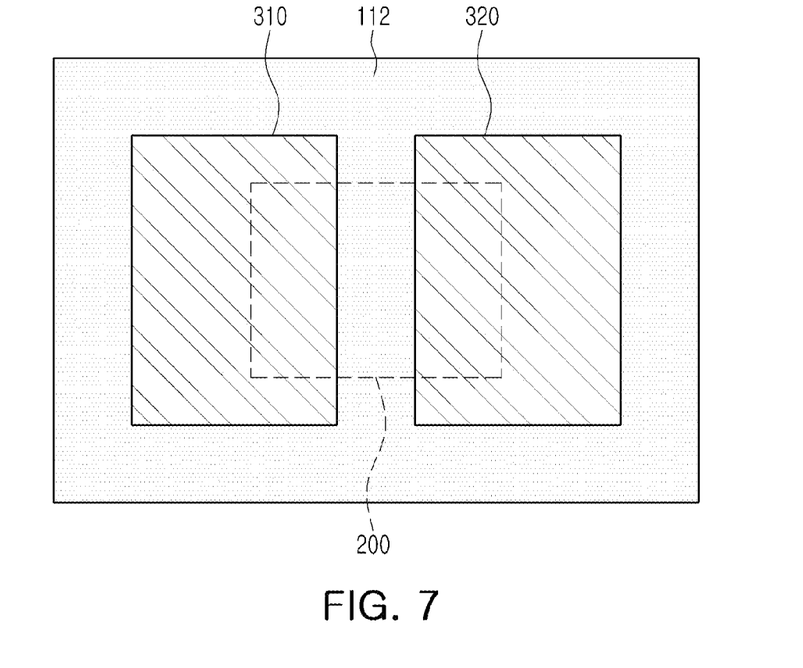
FIG. 7 is a plan diagram illustrating the connection structure embedded substrate illustrated in FIG. 6.

FIG. 7 is a plan diagram illustrating the connection structure embedded substrate illustrated in FIG. 6.

Referring to the drawings, in a connection structure embedded substrate 500A2 in the modified example, a plurality of electronic components 310 and 320 may be surface-mounted on the printed circuit board 100 through the bumps 310B and 320B and the electrical connection metal 400, differently from the connection structure embedded substrate 500A1 described in the aforementioned example embodiment. At least a portion of each of the plurality of electronic components 310 and 320 may be configured as an integrated circuit (IC) die in which hundreds to millions of devices are integrated in a single chip. If necessary, the plurality of electronic components 310 and 320 may further include a chip-type inductor or a chip-type capacitor in addition to the IC die. The bumps 310B and 320B may include a metal material such as copper (Cu). The electrical connection metal 400 may include tin (Sn) or an alloy containing tin (Sn), such as solder.

As the descriptions of the other configurations may be the same as above, the detailed descriptions thereof will not be repeated.

Figure 8:
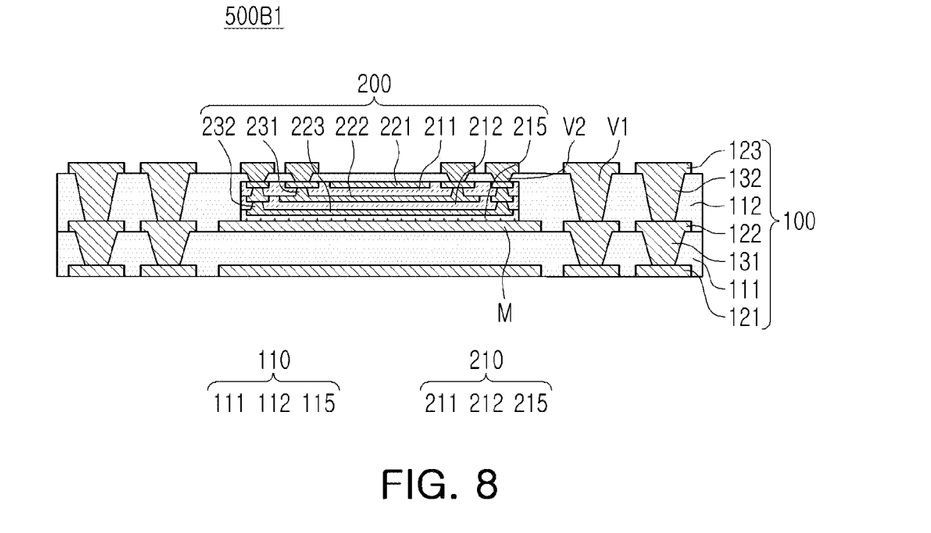
FIG. 8 is a cross-sectional diagram illustrating another example of a connection structure embedded substrate.

FIG. 8 is a cross-sectional diagram illustrating another example of a connection structure embedded substrate.

Referring to the drawings, in a connection structure embedded substrate 500B1 in another example embodiment, the first organic insulating layer 115 of the printed circuit board 100 may not be provided, and the connection structure 200 may be bonded to the metal pattern M of the printed circuit board 100 through the semi-cured or partially cured second organic insulating layer 215, differently from the connection structure embedded substrate 500A1 described in the aforementioned example embodiment. When the second organic insulating layer 215 is cured through a curing process after the connection structure 200 is bonded, the connection structure 200 may be fastened. For example, the lower surface of the second organic insulating layer 215, the lowermost layer of the plurality of second insulating layers 211, 212, and 215 of the connection structure 200, may be in contact with an upper surface of the metal pattern M of the first wiring layer 122, disposed in an inner portion, of the plurality of first wiring layers 121, 122, and 123 of the printed circuit board 100, and the metal pattern M may have a width greater than that of the second insulating body 210 of the connection structure 200. Accordingly, an adhesive may not be necessary.

As the descriptions of the other configurations may be the same as above, the detailed descriptions thereof will not be repeated.

Figure 9:
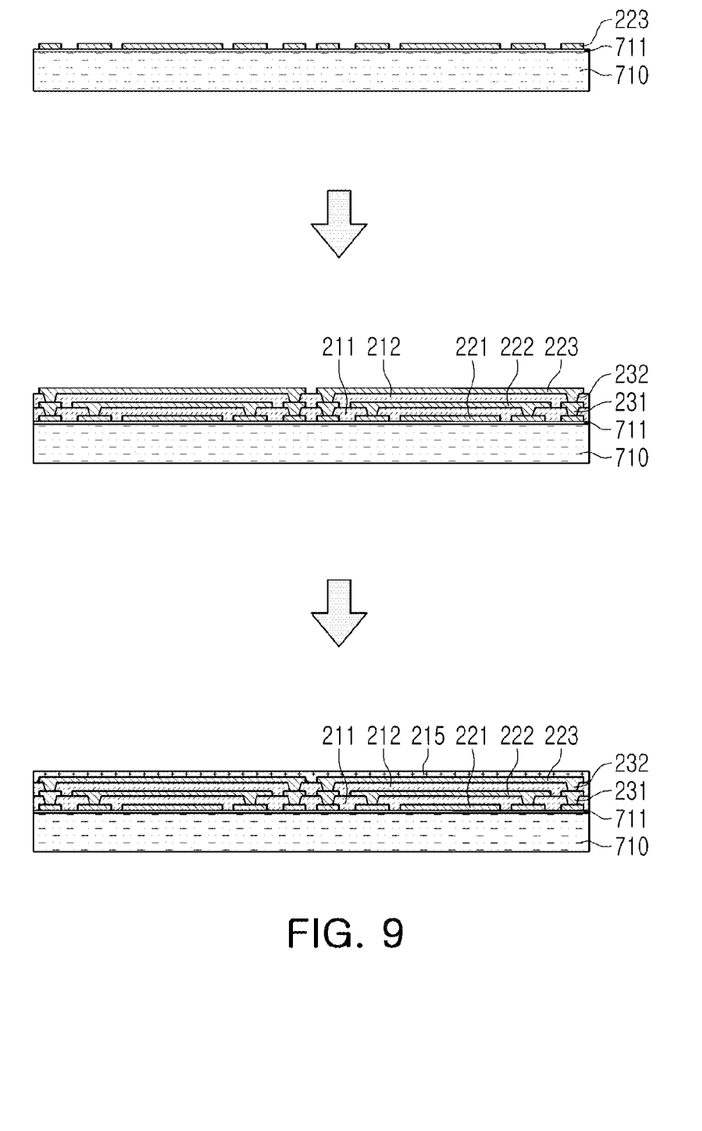
FIGS. 9 and 10 are process diagrams illustrating an example of manufacturing the connection structure embedded substrate illustrated in FIG. 8.
Figure 10:
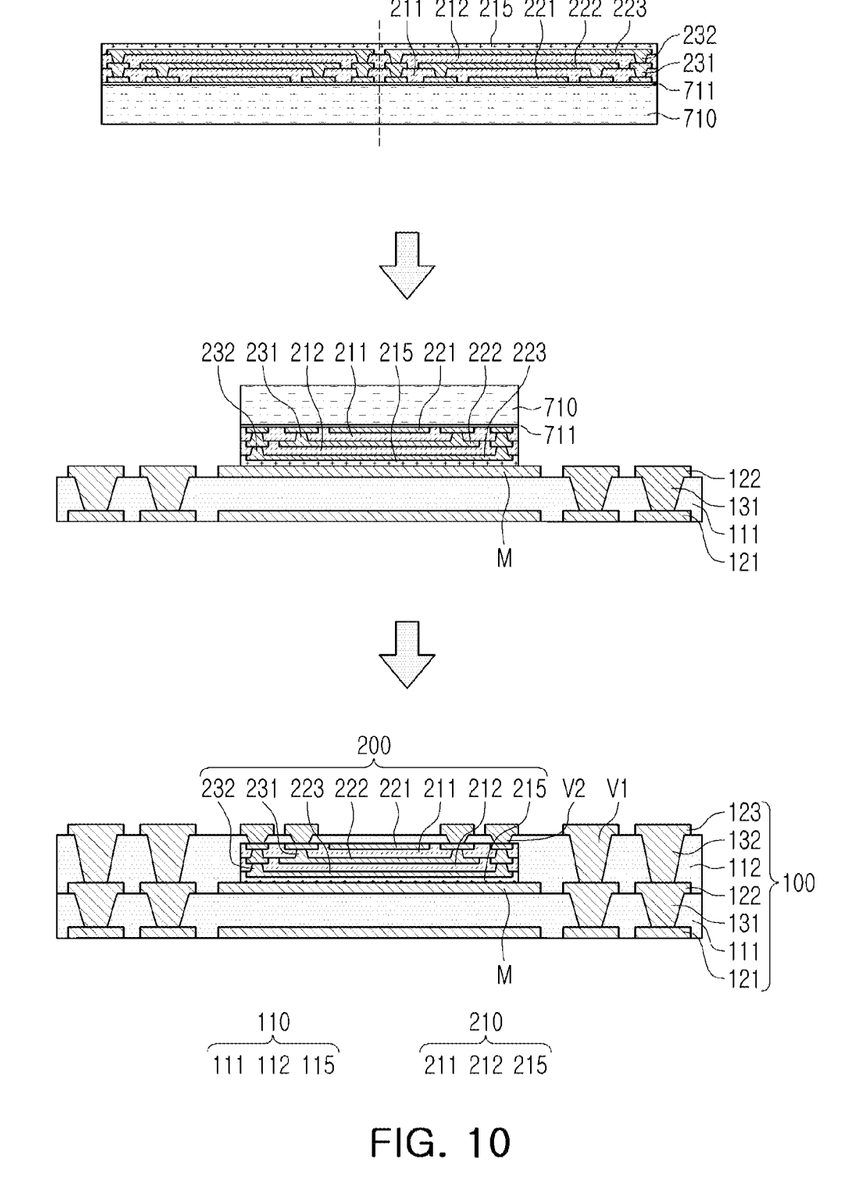

FIGS. 9 and 10 are process diagrams illustrating an example of manufacturing the connection structure embedded substrate illustrated in FIG. 8.

Referring to FIG. 9, a carrier 710 having a seed layer 711 formed on at least one surface thereof may be prepared. Thereafter, a plurality of second insulating layers 211, 212, and 215, a plurality of second wiring layers 221, 222, and 223, and a plurality of second wiring via layers 231, 232, and 233 may be formed on the seed layer 711 of the carrier 710. The plurality of second insulating layers 211, 212, and 215 may be formed by coating and curing an insulating material or laminating and curing an insulating film. The plurality of second wiring layers 221, 222, and 223 may be formed through a plating process. The plurality of second wiring via layers 231, 232, 233 may be formed through a plating process after processing a via hole through a photolithography process, or the like. Accordingly, a laminate may be formed.

Referring to FIG. 10, the laminate may be sawed with the carrier 710 attached, and a laminate provided by a unit, the connection structure 200, may be bonded to the metal pattern M of the precursor of the printed circuit board 100 using the semi-cured or partially cured second organic insulating layer 215. Thereafter, the carrier 710 may be separated, and the seed layer 711 may be removed by etching. Thereafter, the connection structure 200 is embedded by the 1-2 insulating layer 112, the other necessary processes may be performed, and the connection structure 200 may be fastened through a curing process, thereby manufacturing the internal substrate 500B1.

Figure 11:
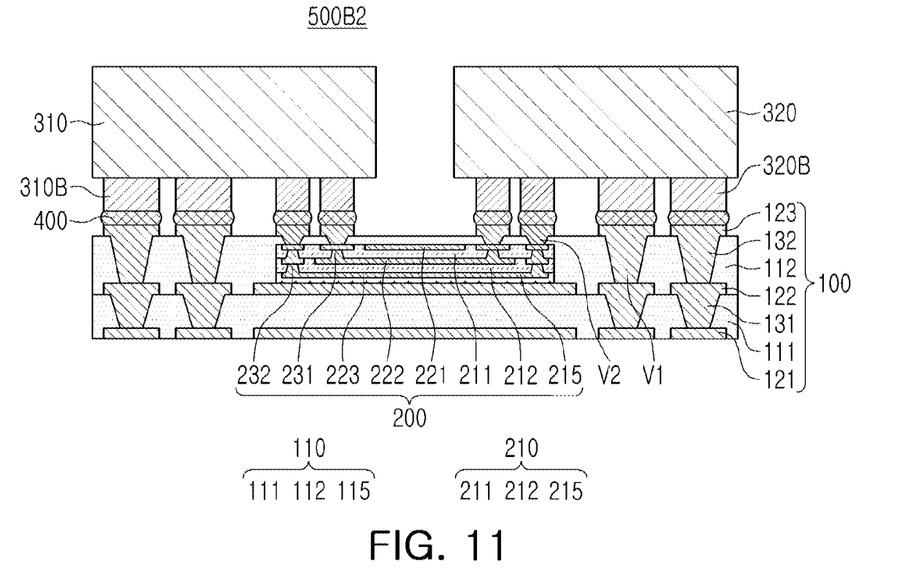
FIG. 11 is a cross-sectional diagram illustrating a modified example of the connection structure embedded substrate illustrated in FIG. 8.

FIG. 11 is a cross-sectional diagram illustrating a modified example of the connection structure embedded substrate illustrated in FIG. 8.

Figure 12:
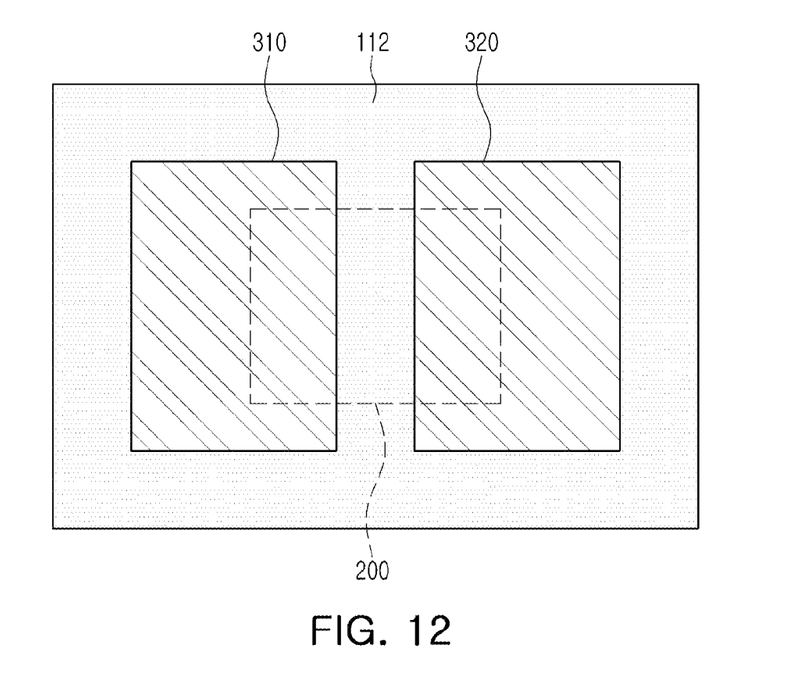
FIG. 12 is a plan diagram illustrating the connection structure embedded substrate illustrated in FIG. 11.

FIG. 12 is a plan diagram illustrating the connection structure embedded substrate illustrated in FIG. 11.

Referring to the diagrams, in the connection structure internal substrate 500B2 in the modified example, a plurality of electronic components 310 and 320 may be surface-mounted on the printed circuit board 100 through bumps 310B and 320B and the electrical connection metal 400, differently from the connection structure internal substrate 500B1 described in the aforementioned example embodiment. At least portions of each of the plurality of electronic components 310 and 320 may be electrically connected to each other through the connection structure 200. Each of the plurality of electronic components 310 and 320 may be configured as an IC die in which hundreds to millions of devices are integrated in a single chip. If necessary, the plurality of electronic components 310 and 320 may further include a chip-type inductor or a chip-type capacitor in addition to the IC die. The bumps 310B and 320B may include a metal material such as copper (Cu). The electrical connection metal 400 may include tin (Sn) or an alloy containing tin (Sn), such as solder.

As the descriptions of the other configurations may be the same as above, the detailed descriptions thereof will not be repeated.

According to the aforementioned example embodiments, the connection structure may be embedded in the substrate without forming a cavity and without an adhesive for bonding the connection structure.

Also, a connection structure embedded substrate which may improve electrical properties in die-to-die transmission of a high-speed signal may be provided.

In the example embodiments, the terms "side portion," "side surface," and the like, may be used to refer to a surface formed taken in right/left directions with reference to a cross-section in the diagrams for ease of description, the terms "upper side," "upper portion," "upper surfaces," and the like, may be used to refer to a surface formed in an upward direction with reference to a cross-section in the diagrams for ease of description, and the terms "lower side," "lower portion," "lower surface," and the like, may be used to refer to a surface formed in a downward direction. The notion that an element is disposed on a side region, an upper side, an upper region, or a lower resin may include the configuration in which the element is directly in contact with an element configured as a reference in respective directions, and the configuration in which the element is not directly in contact with the reference element. The terms, however, may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

While the example embodiments have been illustrated and described above, it will be apparent to those skilled in the art that modifications and variations could be made without departing from the scope of the present invention as defined by the appended claims.

What is claimed is:

1. A connection structure embedded substrate, comprising:
   a printed circuit board including a plurality of first insulating layers, and a plurality of first wiring layers disposed on or between the plurality of first insulating layers; and
   a connection structure embedded in the printed circuit board, and including a plurality of second insulating layers and a plurality of second wiring layers disposed on or between the plurality of second insulating layers,
   wherein a lowermost second insulating layer of the plurality of second insulating layers includes an organic insulating material, and is in contact with an upper surface of one of the plurality of first insulating layers, and
   wherein the upper surface of the one of the plurality of first insulating layers has a stepped portion in a region in contact with the lowermost second insulating layer of the plurality of second insulating layers.

2. The connection structure embedded substrate of claim 1, wherein an average density of the plurality of second wiring layers higher than an average density of the plurality of first wiring layers.

3. The connection structure embedded substrate of claim 2, wherein, when a pitch of at least one of the plurality of first wiring layers is defined as a first pitch, and a pitch of at least one of the plurality of second wiring layers is defined as a second pitch, the first pitch is greater than the second pitch.

4. The connection structure embedded substrate of claim 2, wherein, when an average gap between the plurality of first wiring layers is defined as a first gap, and an average gap between the plurality of second wiring layers is defined as a second gap, the first gap is greater than the second gap.

5. The connection structure embedded substrate of claim 1, wherein the one of the plurality of first insulating layers includes at least one of an Ajinomoto build-up film (ABF) and polyimide.

6. The connection structure embedded substrate of claim 5, wherein the lowermost second insulating layer of the plurality of second insulating layers includes at least one of an Ajinomoto build-up film (ABF) and polyimide.

7. The connection structure embedded substrate of claim 6,
   wherein an uppermost second wiring layer of the plurality of second wiring layers is embedded in an upper side of an uppermost second insulating layer of the plurality of second insulating layers and an upper surface thereof is exposed, and
   wherein the exposed upper surface is connected to at least a portion of one of the plurality of first wiring layers through a wiring via.

8. The connection structure embedded substrate of claim 1,
   wherein the printed circuit board further includes a plurality of first wiring vias,
   wherein the connection structure further includes a plurality of second wiring vias, and
   wherein the first and second wiring vias have tapered shapes, tapered in opposite directions.

9. The connection structure embedded substrate of claim 1,
   wherein one of the plurality of first wiring layers includes a metal layer, and
   wherein the metal layer is disposed in a lower side of the connection structure and is spaced apart from the connection structure.

10. The connection structure embedded substrate of claim 9, wherein a width of the metal layer is greater than a width of the connection structure.

11. The connection structure embedded substrate of claim 1, further comprising:
    a plurality of electronic components disposed on the printed circuit board,
    wherein at least portions of each of the plurality of electronic components are electrically connected to each other through the connection structure.

12. A connection structure embedded substrate, comprising:
    a printed circuit board including a plurality of first insulating layers, a plurality of first wiring layers, and a plurality of first wiring via layers; and
    a connection structure embedded in one of the first insulating layers of the printed circuit board and including a plurality of second insulating layers, a plurality of second wiring layers, and a plurality of second wiring via layers,
    wherein an uppermost second wiring layer of the plurality of second wiring layers is embedded in an upper side of an uppermost second insulating layer of the plurality of second insulating layers and an upper surface thereof is exposed, and wherein a via of the first wiring via layers, which is disposed in the one of the first insulating layers of the printed circuit board, is tapered in a direction opposite to a direction in which the second wiring via layers are tapered, wherein a lowermost second insulating layer of the plurality of second insulating layers includes an organic insulating material.

13. The connection structure embedded substrate of claim 12, wherein the lowermost second insulating layer of the plurality of second insulating layers includes at least one of an Ajinomoto build-up film (ABF) and polyimide satisfying a condition of the dielectric dissipation factor (Df).

14. The connection structure embedded substrate of claim 12, wherein a lower surface of the lowermost second insulating layer of the plurality of second insulating layers is in contact with an upper surface of one of the plurality of first insulating layers.

15. The connection structure embedded substrate of claim 12,
wherein one of the plurality of first wiring layers includes a metal layer, and
wherein the lower surface of the lowermost second insulating layer of the plurality of second insulating layers is in contact with an upper surface of the metal layer.

16. A connection structure embedded substrate, comprising:
a printed circuit board including a plurality of first insulating layers, and a plurality of first wiring layers disposed on or between the plurality of first insulating layers; and
a connection structure embedded in the printed circuit board, and including a plurality of second insulating layers and a plurality of second wiring layers disposed on or between the plurality of second insulating layers,
wherein a lowermost second insulating layer of the plurality of second insulating layers is disposed on a lower surface of a lowermost second wiring layer of the plurality of second wiring layers,
an uppermost first insulating layer of the plurality of first insulating layer covers a side surface and an upper surface of the connection structure,
an uppermost first wiring layer of the plurality of first wiring layers is connected to the connection structure through a first via disposed in a portion of the uppermost first insulating layer covering the connection structure, and is connected to one of the plurality of first wiring layers through a second via penetrating through the uppermost first insulating layer, and
a thickness of the second via is greater than a thickness of the connection structure.

17. The connection structure embedded substrate of claim 16, wherein the lowermost second insulating layer of the plurality of second insulating layers is in contact with one of the plurality of first insulating layers.

18. The connection structure embedded substrate of claim 17, wherein an upper surface of the one of the plurality of first insulating layers has a stepped portion in a region in contact with the lowermost second insulating layer of the plurality of second insulating layers.

19. The connection structure embedded substrate of claim 16, wherein the connection structure is disposed on one of the plurality of first insulating layers, and
the lowermost second insulating layer of the plurality of second insulating layers or the one of the plurality of first insulating layers includes an Ajinomoto build-up film (ABF) or polyimide.

20. The connection structure embedded substrate of claim 16, wherein the connection structure is disposed on one of the plurality of first insulating layers, and
a dielectric dissipation factor (Df) of the lowermost second insulating layer of the plurality of second insulating layers or of a dielectric dissipation factor (Df) of the one of the plurality of first insulating layers is 0.010 or less.

21. The connection structure embedded substrate of claim 16, wherein a lower surface of the lowermost second insulating layer of the plurality of second insulating layers is in contact with the one of the plurality of first wiring layers.

22. The connection structure embedded substrate of claim 12, wherein the organic insulating material included in the lowermost second insulating layer of the plurality of second insulating layers has a dielectric dissipation factor (Df) of 0.010 or less.

23. A connection structure embedded substrate, comprising:
a printed circuit board including a plurality of first insulating layers, and a plurality of first wiring layers disposed on or between the plurality of first insulating layers; and
a connection structure embedded in the printed circuit board, and including a plurality of second insulating layers and a plurality of second wiring layers disposed on or between the plurality of second insulating layers,
wherein a lowermost second insulating layer of the plurality of second insulating layers includes an organic insulating material, and is in contact with an upper surface of one of the plurality of first insulating layers,
wherein one of the plurality of first wiring layers includes a metal layer,
wherein the metal layer is disposed in a lower side of the connection structure and is spaced apart from the connection structure, and
wherein a width of the metal layer is greater than a width of the connection structure.

* * * * *